United States Patent
Bernard et al.

(10) Patent No.: US 9,132,639 B2
(45) Date of Patent: Sep. 15, 2015

(54) METHOD FOR FABRICATING FLUID EJECTION DEVICE

(75) Inventors: David Bernard, Lexington, KY (US); Andrew McNees, Lexington, KY (US); James Mrvos, Lexington, KY (US)

(73) Assignee: Funai Electric Co., Ltd. (JP)

( * ) Notice: Subject to any disclaimer, the term of this patent is extended or adjusted under 35 U.S.C. 154(b) by 1047 days.

(21) Appl. No.: 13/097,566

(22) Filed: Apr. 29, 2011

(65) Prior Publication Data

US 2012/0273594 A1    Nov. 1, 2012

(51) Int. Cl.
*B41J 2/16*    (2006.01)
*B41J 2/14*    (2006.01)
*H01L 21/265*    (2006.01)

(52) U.S. Cl.
CPC .............. *B41J 2/1621* (2013.01); *B41J 2/1603* (2013.01); *B41J 2/1632* (2013.01); *B41J 2/1634* (2013.01); *H01L 21/265* (2013.01); *Y10T 29/42* (2015.01); *Y10T 29/49083* (2015.01); *Y10T 29/49155* (2015.01); *Y10T 29/49165* (2015.01); *Y10T 29/49401* (2015.01)

(58) Field of Classification Search
CPC ...... B41J 2/1603; B41J 2/1621; B41J 2/1632; B41J 2/1634; H01L 21/265; Y10T 29/42; Y10T 29/49083; Y10T 29/49155; Y10T 29/49165; Y10T 29/49401

USPC ........ 29/611, 890.1, 25.35, 846, 852; 438/21, 438/200, 229; 347/61, 63, 65
See application file for complete search history.

(56) References Cited

U.S. PATENT DOCUMENTS

| | | | |
|---|---|---|---|
| 4,224,733 A | * | 9/1980 | Spadea .......................... 438/229 |
| 6,679,587 B2 | * | 1/2004 | Chen et al. ...................... 347/63 |
| 2003/0186474 A1 | * | 10/2003 | Haluzak et al. ................. 438/21 |
| 2007/0188551 A1 | * | 8/2007 | Chen et al. ................ 29/890.1 X |

FOREIGN PATENT DOCUMENTS

JP    2007266124 A   * 10/2007

* cited by examiner

*Primary Examiner* — A. Dexter Tugbang
(74) *Attorney, Agent, or Firm* — Amster, Rothstein, Ebenstein LLP

(57) ABSTRACT

A method for fabricating an ejection chip of a fluid ejection device includes forming a drive circuitry layer on a substrate, fabricating at least one fluid ejection element on the substrate, forming at least one slot within a top portion of the substrate, filling each slot of the at least one slot with a protective material, grinding the substrate from a bottom portion of the substrate up to a predetermined height, removing the protective material from the each slot of the at least one slot, and laminating a flow feature layer and a nozzle plate over the substrate having the at least one slot.

6 Claims, 11 Drawing Sheets

METHOD FOR FABRICATING FLUID EJECTION DEVICE

CROSS REFERENCES TO RELATED APPLICATIONS

None.

STATEMENT REGARDING FEDERALLY SPONSORED RESEARCH OR DEVELOPMENT

None.

REFERENCE TO SEQUENTIAL LISTING, ETC

None.

BACKGROUND

1. Field of the Disclosure

The present disclosure relates generally to fluid ejection devices for printers, and more particularly, to a method for fabricating a fluid ejection device.

2. Description of the Related Art

A typical fluid ejection device (printhead) for a printer, such as an inkjet printer, includes a substrate (silicon wafer) carrying at least one fluid ejection element thereupon; a flow feature layer configured over the substrate; and a nozzle plate configured over the flow feature layer. The nozzle plate and the flow feature layer of the fluid ejection device are generally formed as thick layers of polymeric materials. Further, the fluid ejection device includes a drive circuitry layer that may be made using complementary metal-oxide-semiconductor implantation. Such a drive circuitry layer is electrically coupled with the at least one fluid ejection element, and assists in electrically connecting the fluid ejection device to the printer during use.

FIGS. 1-8 depict a typical process flow for fabrication of a fluid ejection device 100 (as depicted in FIG. 8). FIG. 1 depicts a substrate 110 having a top portion 112 and a bottom portion 114. FIG. 2 depicts formation of a drive circuitry layer 130 on the substrate 110. Subsequently, fluid ejection elements 150, 170 are fabricated on the top portion 112 of the substrate 110, as depicted in FIG. 3. Each fluid ejection element of the fluid ejection elements 150, 170 is electrically coupled to the drive circuitry layer 130. Thereafter, the substrate 110 is subjected to grinding from the bottom portion 114 thereof up to a predetermined height, 'H1' (referring to FIGS. 2 and 3). Subsequently, a planarization layer 190 (polymeric layer) is formed over the top portion 112, and particularly over selective regions (not numbered) of the top portion 112 of the substrate 110, as depicted in FIG. 4. Thereafter, exposed regions (not numbered), i.e., without any planarization layer 190, of the top portion 112 of the substrate 110 are etched using Deep Reactive Ion Etching (DRIE) technique to configure at least one slot, such as slots 116, 118, within the top portion 112 of the substrate 110, as depicted in FIG. 5. Each slot of the at least one slot serves as a fluid via of the fluid ejection device 100.

Subsequently, a layer 210 of an etch-stop material is then deposited over the exposed regions of the top portion 112 of the substrate 110 while filling the slots 116, 118 with the etch-stop material, as depicted in FIG. 6. Thereafter, the bottom portion 114 of the substrate 110 is etched to configure at least one fluid feed trench, such as a fluid feed trench 120, within the bottom portion 114 of the substrate 110, as depicted in FIG. 7. The fluid feed trench 120 is in fluid communication with the slots 116, 118. Subsequently, the layer 210 of the etch-stop material is removed from the top portion 112 of the substrate 110. Thereafter, a nozzle plate 230 (photo-imageable layer) is formed over the planarization layer 190. The planarization layer 190 serves as the flow feature layer of the fluid ejection device 100.

However, such a method of fabricating fluid ejection devices is incapable of allowing aggressive post-DRIE clean-ups, in order to avoid any damage to the flow feature layer. Specifically, available DRIE etching processes and strip methods are limited by the presence of the flow feature layer and the necessity of keeping the flow feature layer intact for permanent bonding of the nozzle plate. More specifically, clean-ups after DRIE etching processes may affect the adhesion of the nozzle plate to the flow feature layer. Further, performing DRIE etching processes post formation of the flow feature layer has also facilitated corrosion (manifestations such as ink ingression) of the fluid ejection devices.

In addition, application of DRIE etching processes that employ hydrophobic polymers in masking and passive layers proves to be unsuitable, as the hydrophobic polymers are difficult and expensive to remove. Thus, many prior art methods that employ such DRIE etching processes for fabricating fluid ejection devices are cost-ineffective.

Accordingly, there persists a need for an efficient and a cost-effective method for fabricating fluid ejection devices for printers without causing any damage to flow feature layers and nozzle plates of the fluid ejection devices.

SUMMARY OF THE DISCLOSURE

In view of the foregoing disadvantages inherent in the prior art, the general purpose of the present disclosure is to provide a method for fabricating a fluid ejection device, by including all the advantages of the prior art, and overcoming the drawbacks inherent therein.

In one aspect, the present disclosure provides a method for fabricating a fluid ejection device. The method includes forming a drive circuitry layer on a substrate. The method further includes fabricating at least one fluid ejection element on the substrate. Each fluid ejection element of the at least one fluid ejection element is electrically coupled to the drive circuitry layer. Furthermore, the method includes forming at least one slot within a top portion of the substrate. The method also includes filling each slot of the at least one slot with a protective material. In addition, the method includes grinding the substrate from a bottom portion of the substrate up to a predetermined height. Moreover, the method includes removing the protective material from the each slot of the at least one slot. Additionally, the method includes depositing a layer of a polymeric bonding material on a bottom surface of the substrate, such that the layer of the polymeric bonding material partially covers the bottom surface of the substrate. The method also includes attaching a manifold chip to the layer of the polymeric bonding material. The manifold chip includes at least one fluid feed trench. Each fluid feed trench of the at least one fluid feed trench is in fluid communication with one or more corresponding slots of the at least one slot. Further, the method includes laminating a flow feature layer and a nozzle plate over the substrate having the at least one slot formed therewithin.

In another aspect, the present disclosure provides a method for fabricating an ejection chip of a fluid ejection device. The method includes forming a drive circuitry layer on a substrate. The method further includes fabricating at least one fluid ejection element on the substrate. Each fluid ejection element of the at least one fluid ejection element is electrically coupled to the drive circuitry layer. Furthermore, the method includes forming at least one slot within a top portion of the substrate. The method also includes filling each slot of the at least one slot with a protective material. Additionally, the method includes grinding the substrate from a bottom portion of the substrate up to a predetermined height. Moreover, the method includes removing the protective material from the each slot of the at least one slot.

In yet another aspect, the present disclosure provides an ejection chip for a fluid ejection device. The ejection chip includes a substrate comprising at least one slot formed within the substrate. The ejection chip further includes a drive circuitry layer formed on the substrate. Furthermore, the ejection chip includes at least one fluid ejection element fabricated on the substrate. Each fluid ejection element of the at least one fluid ejection element is electrically coupled to the drive circuitry layer. In addition, the ejection chip includes a flow feature layer and a nozzle plate laminated over the substrate having the at least one slot formed therewithin. The at least one slot is formed within the substrate prior to the lamination of the flow feature layer and the nozzle plate.

BRIEF DESCRIPTION OF THE DRAWINGS

The above-mentioned and other features and advantages of the present disclosure, and the manner of attaining them, will become more apparent and will be better understood by reference to the following description of embodiments of the disclosure taken in conjunction with the accompanying drawings, wherein.

DETAILED DESCRIPTION

It is to be understood that various omissions and substitutions of equivalents are contemplated as circumstances may suggest or render expedient, but these are intended to cover the application or implementation without departing from the spirit or scope of the claims of the present disclosure. It is to be understood that the present disclosure is not limited in its application to the details of components set forth in the following description. The present disclosure is capable of other embodiments and of being practiced or of being carried out in various ways. Also, it is to be understood that the phraseology and terminology used herein is for the purpose of description and should not be regarded as limiting. The use of "including," "comprising," or "having" and variations thereof herein is meant to encompass the items listed thereafter and equivalents thereof as well as additional items. Further, the terms "a" and "an" herein do not denote a limitation of quantity, but rather denote the presence of at least one of the referenced item.

Figure 1:
FIGS. 1-8 depict a prior art process flow for fabrication of a fluid ejection device.
Figure 2:
Figure 3:
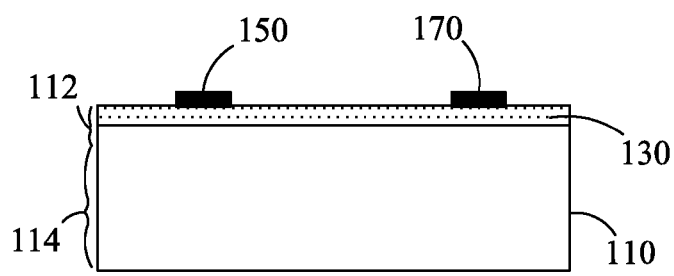
Figure 4:
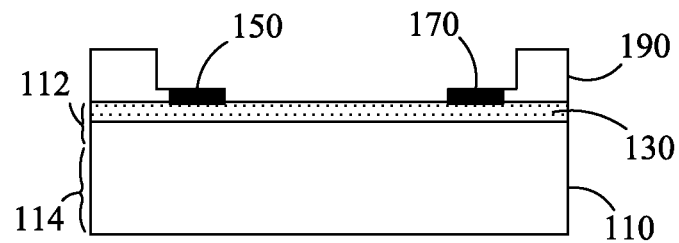
Figure 5:
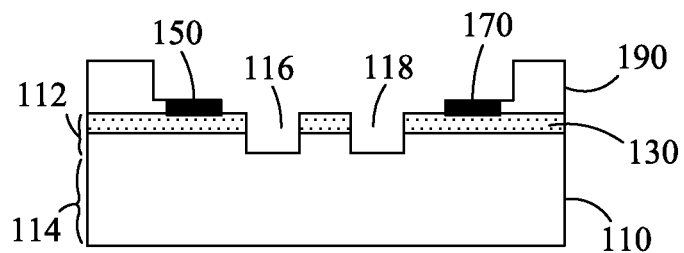
Figure 6:
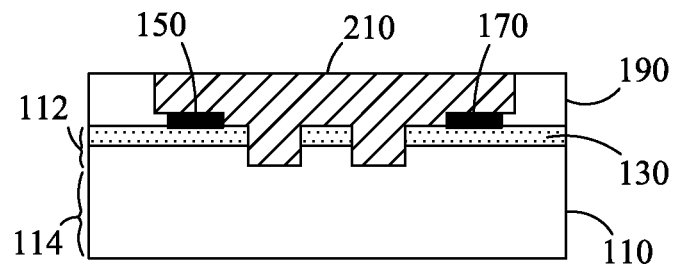
Figure 7:
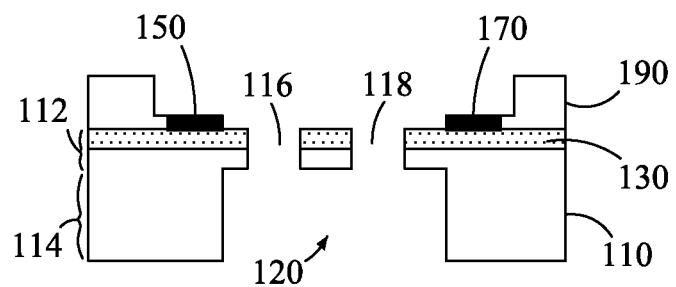
Figure 8:
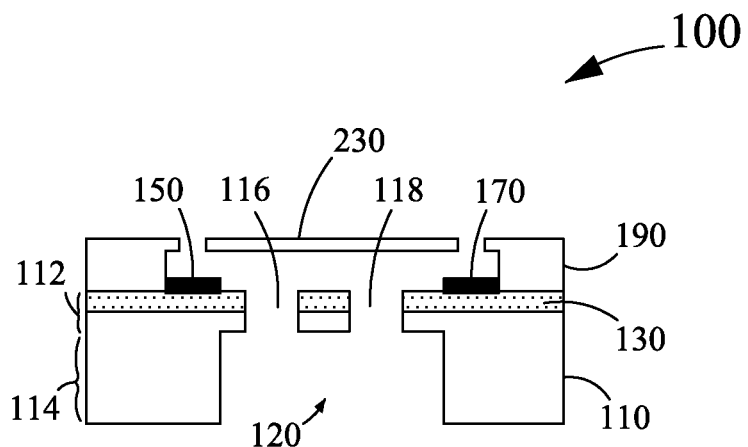
Figure 9:
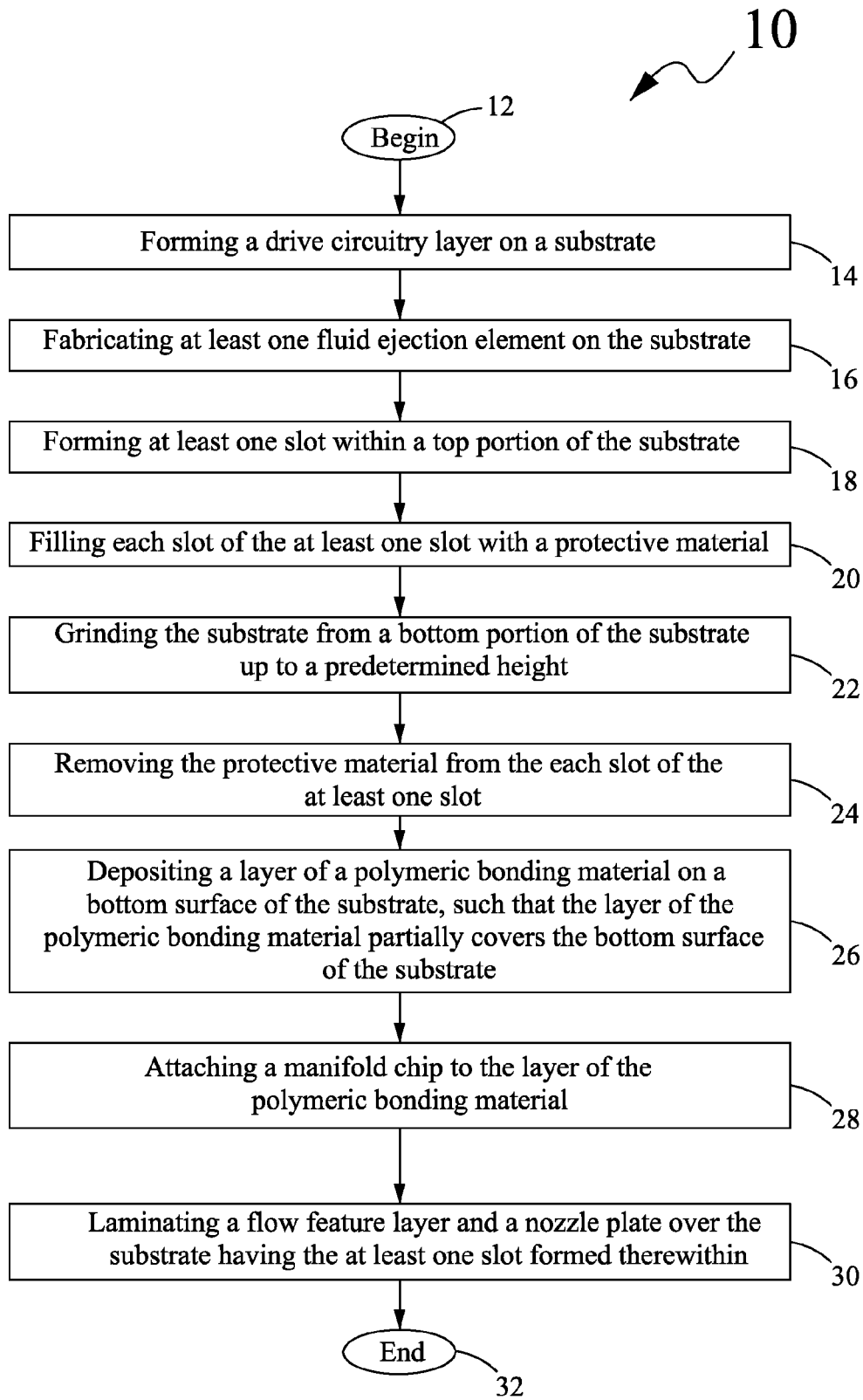
FIG. 9 depicts a flow chart illustrating a method for fabricating a fluid ejection device, in accordance with an embodiment of the present disclosure.

The present disclosure provides a method for fabricating a fluid ejection device. The fluid ejection device is in the form of a printhead for use in printers, such as inkjet printers. The method for fabrication of the fluid ejection device is explained in conjunction with FIG. 9 and FIGS. 10-18. FIG. 9 depicts a flow chart illustrating a method 10 for fabricating a fluid ejection device 300, in accordance with an embodiment of the present disclosure. FIGS. 10-18 depict a process flow for the fabrication of the fluid ejection device 300 using the method 10 of FIG. 9.

Figure 10:
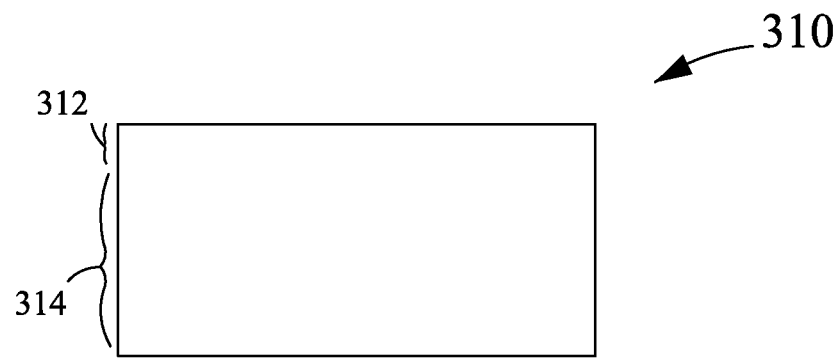
FIGS. 10-18 depict a process flow for the fabrication of the fluid ejection device using the method of FIG. 9.
Figure 11:
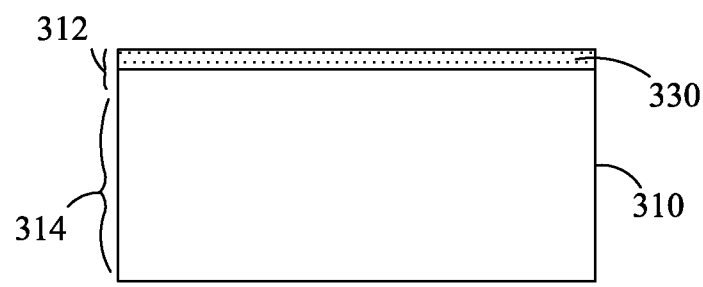

Referring to FIG. 9, the method 10 begins at 12. A substrate 310 is provided, as depicted in FIG. 10. The substrate 310 is a silicon wafer and may have a height of about 725 micrometers ($\mu m$). Without departing from the scope of the present disclosure, the substrate 310 may have any shape and size as per a manufacturer's preference. Further, the substrate 310 may be composed of any other semi-conductor material that is suitable for the fabrication of fluid ejection devices. The substrate 310 includes a top portion 312 and a bottom portion 314. At 14, a drive circuitry layer 330 is formed on the substrate 310, as depicted in FIG. 11. The drive circuitry layer 330 is formed by complementary metal-oxide-semiconductor (CMOS) implantation, i.e., the drive circuitry layer 330 includes CMOS drive circuitry, and is formed by techniques as known in the art.

Figure 12:
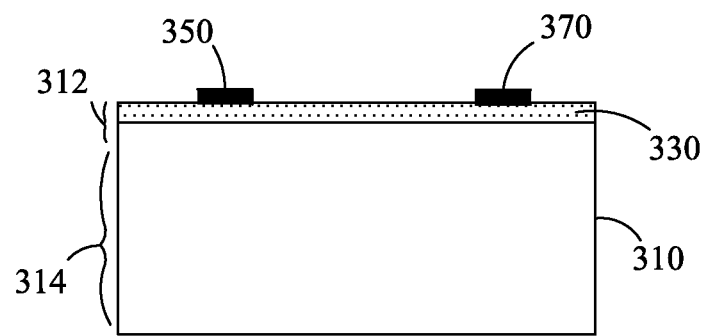

At 16, at least one fluid ejection element, such as fluid ejection elements 350, 370, are fabricated on the substrate 310, as depicted in FIG. 12. Each fluid ejection element of the at least one fluid ejection element, such as the fluid ejection elements 350, 370, is electrically coupled to the drive circuitry layer 330. The fluid ejection elements 350, 370 may be heater resistors or any such other elements that receive electrical signals from the drive circuitry layer 330 for energization in order to eject a droplet of fluid (such as ink).

Figure 13:
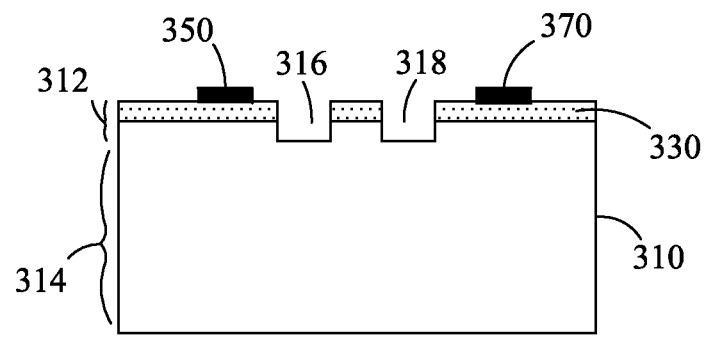

At 18, at least one slot, such as slots 316, 318, is formed within the top portion 312 of the substrate 310, as depicted in FIG. 13. Specifically, each slot of the at least one slot is configured as a shaft that serves as a fluid via, and is formed by etching the top portion 312. More specifically, the top portion 312 may be etched by a deep reactive ion etching (DRIE) technique. However, it will be evident that other techniques as known in the art may be used for the formation of the each slot of the at least one slot. The each slot of the at least one slot may have a depth of about 60 $\mu m$. Further, the each slot may have a width of about 20 $\mu m$. It will be evident that the each slot may have any dimension, as per a manufacturer's preference.

Figure 14:
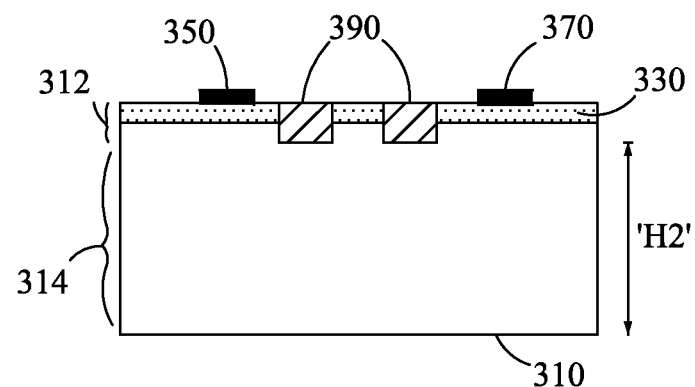

At 20, the each slot of the at least one slot, such as the slots 316, 318, is filled/plugged with a protective material 390, as depicted in FIG. 14. Suitable examples of the protective material 390 include, but are not limited to, polyvinyl alcohol (PVA), polyvinylpyrrolidone (PVP), and spin-on-glass (SOG) material using lift-off to pattern. Alternatively, deep ultraviolet (DUV) resist, such as ODUR, may be patterned as the protective material 390 over the substrate 310 in order to fill/plug the slots 316, 318. Such filling/plugging of the slots 316, 318 is required regardless of the composition of the top portion 312 of the substrate 310 (i.e., with or without a flow feature layer), though sequential laminating of a flow feature layer and then a nozzle plate may enable a broader range of options for filling the slots 316, 318.

Figure 15:
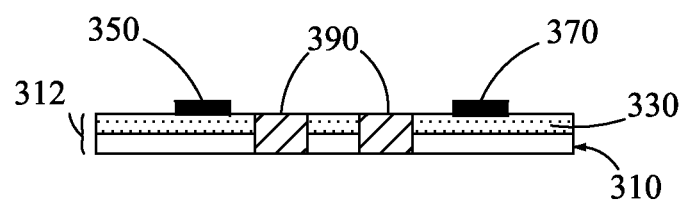

At 22, the substrate 310 is subjected to grinding/wafer thinning (i.e., reduction in height/thickness) from the bottom portion 314 of the substrate 310 up to a predetermined height 'H2', referring to FIGS. 14 and 15. Specifically, the substrate 310 is subjected to back-grinding up to the at least one slot, such as the slots 316, 318 (i.e., up to 60 $\mu m$+/−5 $\mu m$ from the top portion 312), as depicted in FIG. 15. Further, the height/thickness of the substrate 310 may be reduced by techniques that are known in the art. For example, conventional grinding apparatuses may be used for grinding the substrate 310. At this stage, the protective material 390 used for filling/plugging the slots 316, 318 assist in preventing any contamination of the slots 316, 318 from by-products of the grinding of the substrate 310.

Figure 16:
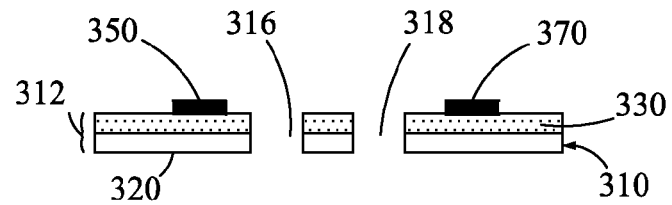
Figure 17:
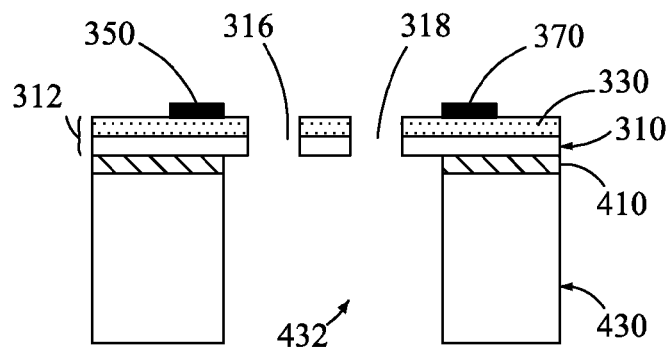

At 24, the protective material 390 is removed from the each slot of the at least one slot, as depicted in FIG. 16. Conventional methods of removing such protective materials may be used to remove the protective material 390 from the slots 316, 318. At 26, a layer 410 of a polymeric bonding material is deposited on a bottom surface 320 (depicted in FIG. 16) of the substrate 310 (ground substrate 310), such that the layer 410 of the polymeric bonding material partially covers the bottom surface 320 of the substrate 310, as depicted in FIG. 17. Specifically, the slots 316, 318 are left uncovered by the layer 410 of the polymeric bonding material. Suitable examples of the polymeric bonding material include, but are not limited to, patterned negative photoresist materials; an adhesive dispensed using a needle or Asymtek dispensing system; and a screened/stenciled adhesive. However, other known polymeric bonding materials deposited by other known techniques, such as pad printing and dip coating, may be used for the purpose of the present disclosure.

At 28, a manifold chip 430 is attached (bonded) to the layer 410 of the polymeric bonding material, as depicted in FIG. 17. Specifically, the characteristic of the layer 410 of the polymeric bonding material assists in the attachment of the manifold chip 430 thereto. Also, the manifold chip 430 may be attached to the layer 410 of the polymeric bonding material using a low temperature (<200° C.) bonding process (wafer bonding process), as known in the art. A low temperature bonding process assists in protecting any polymeric layer (such as a flow feature layer and a nozzle plate) that may be present on the substrate 310 against damage.

The manifold chip 430 is a single chip composed of silicon, as depicted in FIG. 17. However, without departing from the scope of the present disclosure, the manifold chip 430 may be provided in any form, such as a stacked array of chips, as per a manufacturer's preference. Further, the manifold chip 430 may be composed of any other material known in the art for the purpose of the present disclosure. Also, the manifold chip 430 includes at least one fluid feed trench, such as a fluid feed trench 432. Each fluid feed trench of the at least one fluid feed trench is in fluid communication with one or more corresponding slots of the at least one slot. Specifically, the fluid feed trench 432 is in fluid communication with the slots 316, 318. Conventional techniques, such as etching (e.g., DRIE), which are known in the art may be used for the formation of the each fluid feed trench of the at least one fluid feed trench. Further, the each fluid feed trench may have a width of about 300 µm. It will be evident that the each fluid feed trench may have any dimension, as per a manufacturer's preference.

Figure 18:
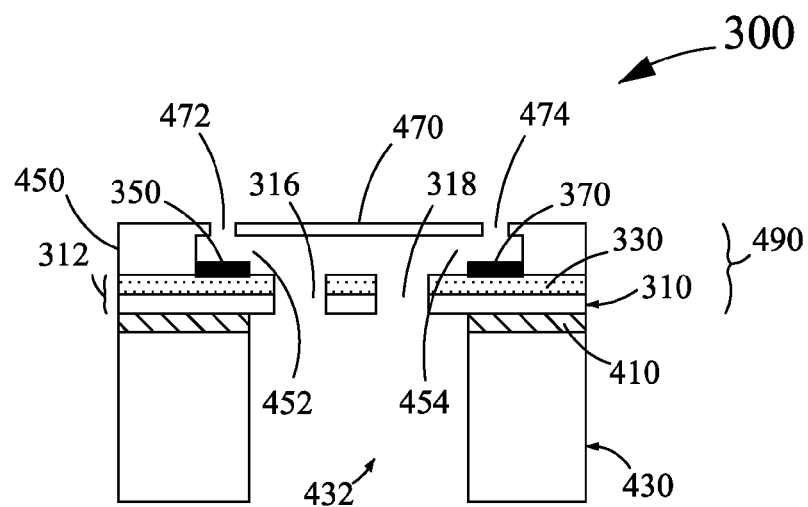

At 30, a flow feature layer 450 and a nozzle plate 470 are laminated over the substrate 310 having the at least one slot, such as the slots 316, 318 formed therewithin, as depicted in FIG. 18. Specifically, the flow feature layer 450 and the nozzle plate 470 may be laminated using lamination processes as known in the art. The flow feature layer 450 includes at least one flow feature (fluid chamber and fluid supply channel), such as flow features 452, 454. Each flow feature of the at least one flow feature is in fluid communication with one or more corresponding slots of the at least one slot. Specifically, the flow feature 452 is in fluid communication with the slot 316, and the flow feature 454 is in fluid communication with the slot 318. The nozzle plate 470 includes at least one nozzle, such as nozzles 472, 474. Each nozzle of the at least one nozzle is in fluid communication with one or more corresponding flow features of the at least one flow feature. Specifically, the nozzle 472 is in fluid communication with the flow feature 452, and the nozzle 474 is in fluid communication with the flow feature 454. The flow feature layer 450 and the nozzle plate 470 may be composed of suitable polymeric materials that are known in the art. Further, the nozzle plate 470 may be a photo-imageable nozzle plate, and may be laminated along with the flow feature layer 450 as a single unit, as depicted in FIG. 18. Alternatively, the flow feature layer 450 and the nozzle plate 470 may be laminated as separate units.

Lamination of the flow feature layer 450 and the nozzle plate 470 over the substrate 310 results in the fabrication of the fluid ejection device 300, as depicted in FIG. 18. Further, the substrate 310 having the at least one slot, along with the at least one fluid ejection element, the drive circuitry layer 330, the laminated flow feature layer 450, and the laminated nozzle plate 470, constitute an ejection chip 490, as depicted in FIG. 18. The method 10 ends at 32.

Though formation of the at least one slot prior to the lamination of the flow feature layer 450 and the nozzle plate 470 over the substrate 310 is specific to the method 10 (i.e., the flow feature layer 450 and the nozzle plate 470 are laminated over the substrate 310 that includes the at least one slot therewithin) of the present disclosure, it should be understood that the aforementioned sequence of other steps of the method 10 is not a limitation to the present disclosure. For instance, the flow feature layer 450 and the nozzle plate 470 may be laminated over the substrate 310 prior to the deposition of the layer 410 of the polymeric bonding material and/or prior to the attachment of the manifold chip 430 to the substrate 310. In such a case, the use of the low temperature bonding process would also be safe for the already laminated flow feature layer 450 and the nozzle plate 470. Similarly, the flow feature layer 450 and the nozzle plate 470 may be laminated over the substrate 310 prior to grinding the substrate 310 from the bottom portion 314 thereof. In such a case, the protective material 390 over the substrate 310 may also be used to protect components (the at least one flow feature and the at least one nozzle) of the flow feature layer 450 and the nozzle plate 470.

Figure 19:
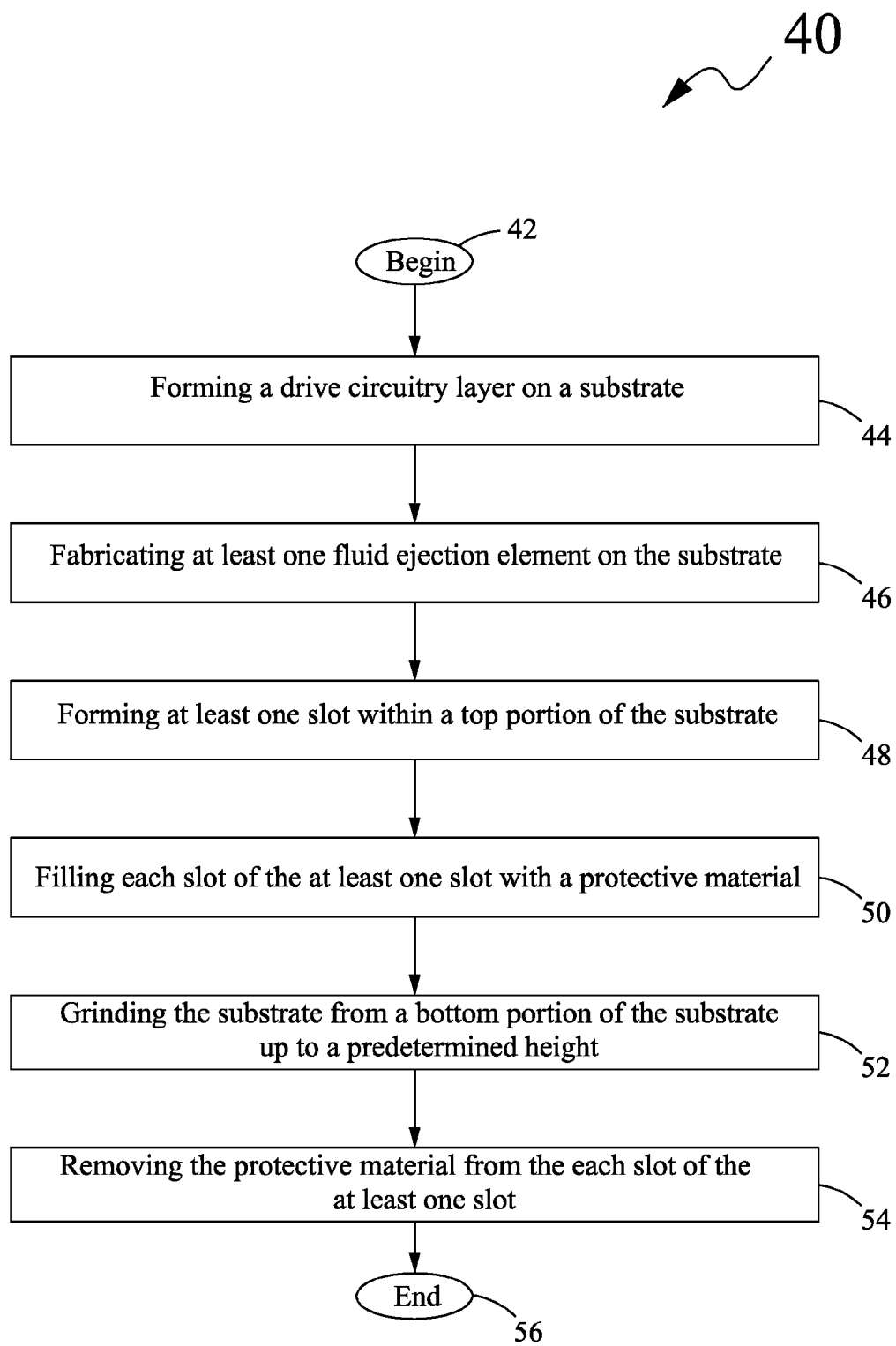
FIG. 19 depicts a flow chart illustrating a method for fabricating an ejection chip for a fluid ejection device, in accordance with an embodiment of the present disclosure.

In another aspect, the present disclosure provides a method for fabricating an ejection chip 500, of a fluid ejection device, such as the fluid ejection device 300. The ejection chip 500 is similar to the ejection chip 490 of FIG. 18, and is fabricated/manufactured using a method 40, as depicted in FIG. 19. FIGS. 20-27 depict a process flow for the fabrication of the ejection chip 500 using the method 40 of FIG. 19.

Figure 20:
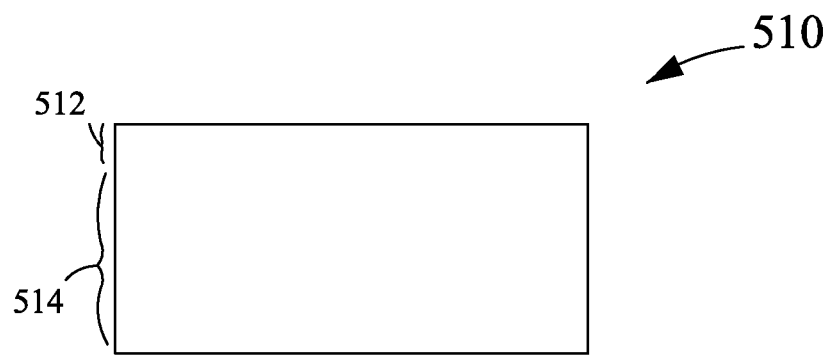
FIGS. 20-27 depict a process flow for the fabrication of the ejection chip using the method of FIG. 19.
Figure 21:
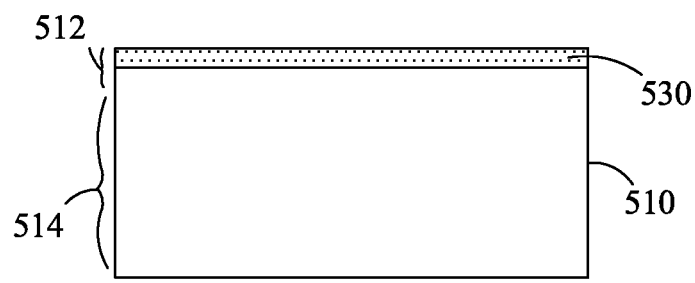
Figure 22:
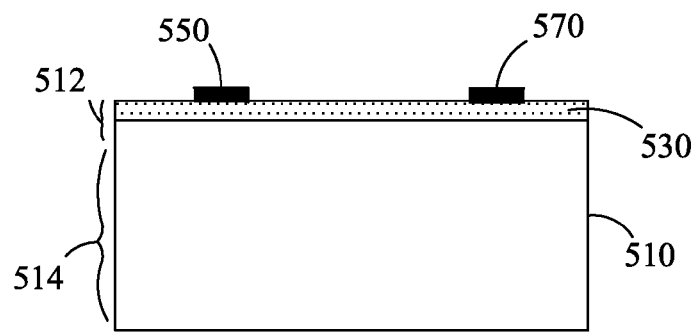
Figure 23:
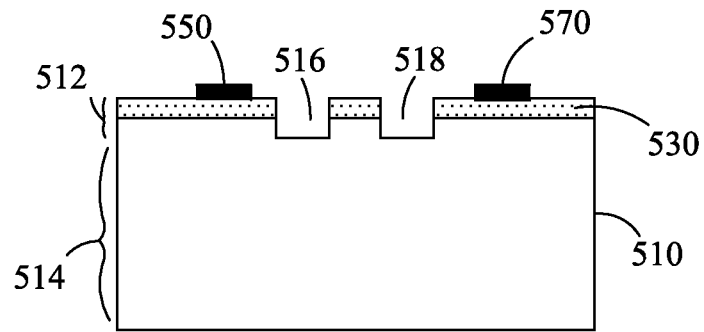

Referring to FIG. 19, the method 40 begins at 42. A substrate 510 is provided, as depicted in FIG. 20. The substrate 510 is similar to the substrate 310 of FIG. 10, and includes a top portion 512 and a bottom portion 514. At 44, a drive circuitry layer 530 is formed on the substrate 510, as depicted in FIG. 21. The drive circuitry layer 530 is similar to the drive circuitry layer 330 of FIG. 11, and is formed in a manner similar to that explained for the formation of the drive circuitry layer 330. At 46, at least one fluid ejection element, such as fluid ejection elements 550, 570, are fabricated on the substrate 510, as depicted in FIG. 22. The fluid ejection elements 550, 570 are similar to the fluid ejection elements 350, 370, and are electrically coupled to the drive circuitry layer 530. At 48, at least one slot, such as slots 516, 518, is formed within the top portion 512 of the substrate 510, as depicted in FIG. 23. Specifically, each slot of the at least one slot is configured as a shaft that serves as a fluid via, and is formed by etching the top portion 512. The slots 516, 518 are similar to the slots 316, 318 of FIG. 13, and are formed in a manner similar to that explained for the formation of the slots 316, 318. The each slot of the at least one slot may have a depth of about 60 µm. Further, the each slot may have a width of about 20 µm. It will be evident that the each slot may have any dimension, as per a manufacturer's preference.

Figure 24:
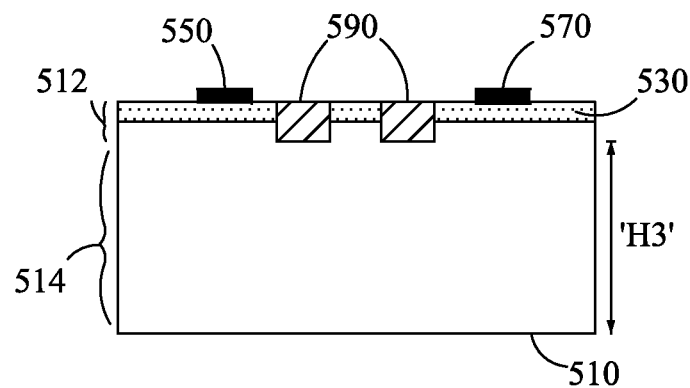
Figure 25:
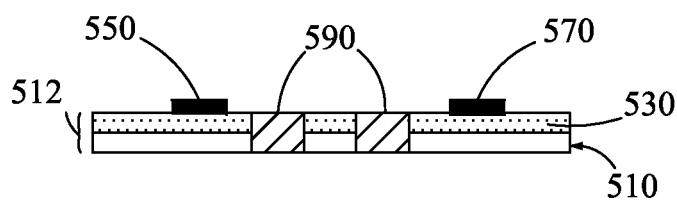

At 50, the each slot of the at least one slot, such as the slots 516, 518, is filled/plugged with a protective material 590, as depicted in FIG. 24. The protective material 590 is similar to the protective material 390. At 52, the substrate 510 is subjected to grinding/wafer thinning (i.e., reduction in height/thickness) from the bottom portion 514 of the substrate 510 up to a predetermined height 'H3', referring to FIGS. 24 and 25. Specifically, the substrate 510 is subjected to back-grinding up to the at least one slot, such as the slots 516, 518 (i.e., up to 60 µm+/−5 µm from the top portion 512), as depicted in FIG. 25. Further, the height/thickness of the substrate 510 may be reduced by techniques that are known in the art. For example, conventional grinding apparatuses may be used for grinding the substrate 510.

Figure 26:
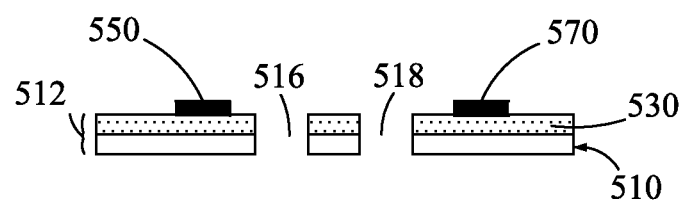
Figure 27:
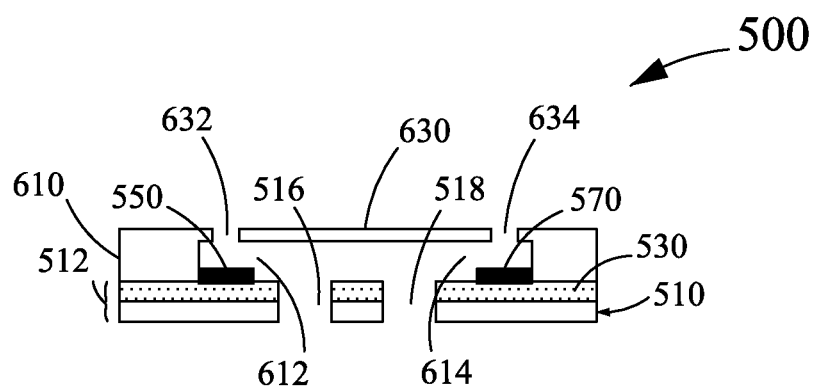

At 54, the protective material 590 is removed from the each slot of the at least one slot, as depicted in FIG. 26. Conventional methods of removing such protective materials may be used to remove the protective material 590 from the slots 516, 518. Subsequently, a flow feature layer 610 and a nozzle plate 630 are laminated over the substrate 510 having the at least one slot, such as the slots 516, 518 formed therewithin, as depicted in FIG. 27. The flow feature layer 610 includes at least one flow feature (fluid chamber and fluid supply channel), such as flow features 612, 614. Each flow feature of the at least one flow feature is in fluid communication with one or more corresponding slots of the at least one slot. Specifically, the flow feature 612 is in fluid communication with the slot 516, and the flow feature 614 is in fluid communication with the slot 518. The nozzle plate 630 includes at least one nozzle, such as nozzles 632, 634. Each nozzle of the at least one nozzle is in fluid communication with one or more corresponding flow features of the at least one flow feature. Specifically, the nozzle 632 is in fluid communication with the flow feature 612, and the nozzle 634 is in fluid communication with the flow feature 614. The flow feature layer 610 and the nozzle plate 630 may be composed of suitable polymeric materials that are known in the art. Further, the nozzle plate 630 may be a photo-imageable nozzle plate and may be laminated along with the flow feature layer 610 as a single unit, as depicted in FIG. 27. Alternatively, the flow feature layer 610 and the nozzle plate 630 may be laminated over the substrate 510 as separate units. The method ends at 56.

The ejection chip 500 may be attached/bonded to any manifold chip, such as the manifold chip 430 of FIGS. 17 and 18, with the help of a layer of a polymeric bonding material, such as the layer 410 of the polymeric bonding material.

In yet another aspect, the present disclosure provides an ejection chip, such as the ejection chip 490 of FIG. 18 and the ejection chip 500 of FIG. 27. The ejection chip includes a substrate, such as the substrates 310, 510, including at least one slot, such as the slots 316, 318; and the slots 516, 518, formed within the substrate. The ejection chip further includes a drive circuitry layer, such as the drive circuitry layers 330, 530, formed on the substrate. The ejection chip also includes at least one fluid ejection element, such as the fluid ejection elements 350, 370; and the fluid ejection elements 550, 570, fabricated on the substrate and electrically coupled to the drive circuitry layer. Furthermore, the ejection chip includes a flow feature layer, such as the flow feature layers 450, 610, laminated over the substrate having the at least one slot formed therewithin. Additionally, the ejection chip includes a nozzle plate, such as the nozzle plates 470, 630, laminated over the flow feature layer. The at least one slot of the substrate is formed therewithin prior to the lamination of the flow feature layer and the nozzle plate over the substrate. The ejection chip of the present disclosure is formed using a method similar to the method 40, and may be attached to a suitable manifold chip, such as the manifold chip 430, as explained with reference to FIG. 17, based on a manufacturer's preference. As the ejection chip along with components thereof is explained in detail with reference to FIGS. 10-18 and FIGS. 20-27, description of the ejection chip of the present disclosure is thus avoided herein for the sake of brevity.

The present disclosure provides a method, such as a method 10, for fabricating a fluid ejection device, such as the fluid ejection device 300. Further, the present disclosure provides a method, such as the method 40, for fabricating an ejection chip, such as the ejection chip 500, for a fluid ejection device. By utilizing the methods 10, 40 of the present disclosure, time required for fabrication reduces. Specifically, time required for performing an etching process (DRIE) is less due to non-requirement of any additional layer of an etch-stop material. Further, etching of a substrate (wafer), such as the substrates 310, 510, is done without any polymeric layers (flow feature layers and nozzle plates) present thereupon, thereby enabling much more aggressive post-DRIE clean-ups. In addition, sequential processing of a flow feature layer, such as the flow feature layers 450, 610, and a nozzle plate, such as the nozzle plates 470, 630, assists in improving adhesion and averts any damage/corrosion of the fluid ejection device 300 and the ejection chip 500. In addition, back-grinding (thinning/reducing thickness or height) of the substrates 310, 510 assists in improving etch exit hole accuracy and uniformity while reducing etch tilt across the substrates 310, 510, and reducing the cost of DRIE etch process substantially. Thus, the use of the methods 10, 40 facilitate in achieving better etch uniformity due to aspect ratio considerations, i.e., deeper is the etching, more is the etch uniformity across the substrate. Moreover, laminated resists that are used for the flow feature layers 450, 610, and the nozzle plates 470, 630, have much better thickness uniformity as compared to spin-coated resists.

Also, ejection chips, such as the ejection chip 500, for use in fluid ejection devices, may easily be fabricated as per a manufacturer's requirements and preferences using the method 40. Accordingly, different types of ejection chips may be fabricated using the method 40, and may be matched and attached to conventional/new manifold chips, thereby allowing modularity. Thus, the method 40 of the present disclosure assists in reducing compound yield loss that is inherent in current art related to compound etching. Additionally, more intricate manifold chip designs may be achieved, as the ejection chip may be fabricated independent of the manifold chip, thereby allowing manifold chip to be any stacked array of chips deemed essential to move a fluid from one point to another as intricately as necessary. Accordingly, substrate (wafer) grinding/leveling/dicing of the ejection chips may be used while employing individually fabricated ejection chips with individual manifold chips.

The foregoing description of several embodiments of the present disclosure has been presented for purposes of illustration. It is not intended to be exhaustive or to limit the disclosure to the precise forms disclosed, and obviously many modifications and variations are possible in light of the above teaching. It is intended that the scope of the disclosure be defined by the claims appended hereto.

The invention claimed is:

1. A method for fabricating an ejection chip of a fluid ejection device, the method comprising:

forming a drive circuitry layer on a substrate;

fabricating at least one fluid ejection element on the substrate, each fluid ejection element of the at least one fluid ejection element being electrically coupled to the drive circuitry layer;

forming at least one slot within a top portion of the substrate;

filling each slot of the at least one slot with a protective material;

grinding the substrate from a bottom portion of the substrate up to a predetermined height;

removing the protective material from the each slot of the at least one slot; and laminating a flow feature layer and a nozzle plate over the substrate having the at least one slot formed therewithin after removing the protective material.

2. The method of claim 1, wherein the flow feature layer comprises at least one flow feature, each flow feature of the at least one flow feature being in fluid communication with one or more corresponding slots of the at least one slot.

3. The method of claim 2, wherein the nozzle plate comprises at least one nozzle, each nozzle of the at least one nozzle being in fluid communication with one or more corresponding flow features of the at least one flow feature.

4. The method of claim 1, wherein the drive circuitry layer is formed by complementary metal-oxide-semiconductor implantation.

5. The method of claim 1, wherein the at least one slot is formed within the top portion of the substrate by etching the top portion.

6. The method of claim 5, wherein the top portion is etched by a deep reactive ion etching technique.

* * * * *